United States Patent
Won et al.

(10) Patent No.: US 7,196,774 B2
(45) Date of Patent: Mar. 27, 2007

(54) LITHOGRAPHY DEVICE

(75) Inventors: Yoo-Keun Won, Kyungki-do (KR); Young-Hee Kim, Kyungki-do (KR); Young-Ho Park, Kyungki-do (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 154 days.

(21) Appl. No.: 10/888,284

(22) Filed: Jul. 9, 2004

(65) Prior Publication Data
US 2005/0006605 A1 Jan. 13, 2005

(30) Foreign Application Priority Data
Jul. 10, 2003 (KR) ............... 10-2003-0046798

(51) Int. Cl.
*G03B 27/72* (2006.01)
(52) U.S. Cl. .......................... 355/71; 355/69
(58) Field of Classification Search ............ 355/53, 355/55, 67–69, 71; 250/548; 356/399–401
See application file for complete search history.

(56) References Cited

U.S. PATENT DOCUMENTS

| 5,712,698 | A * | 1/1998 | Poschenrieder et al. ...... 355/71 |
| 6,396,567 | B1 * | 5/2002 | Chu et al. ...................... 355/69 |
| 6,404,499 | B1 * | 6/2002 | Stoeldraijer et al. ........ 356/400 |
| 6,476,905 | B1 * | 11/2002 | Li ............................... 355/71 |
| 6,563,567 | B1 * | 5/2003 | Komatsuda et al. .......... 355/71 |
| 6,737,662 | B2 * | 5/2004 | Mulder et al. .............. 250/548 |
| 2004/0012764 | A1 * | 1/2004 | Mulder et al. ................ 355/53 |

FOREIGN PATENT DOCUMENTS

| JP | 09-266159 | 10/1997 |
| KR | 1998-080158 | 11/1998 |
| KR | 2001-85493 | 9/2001 |
| KR | 1020030024638 A | 3/2003 |

OTHER PUBLICATIONS

English Language Abstract of Japan Publication No. 09-266159.
English Language Abstract of Korean Publication No. 1020030024638 A.
English language abstract of Korean Publication No. 2001-85493.
English language abstract of Korean Publication No. 1998-080158.

* cited by examiner

*Primary Examiner*—Henry Hung Nguyen
(74) *Attorney, Agent, or Firm*—Marger Johnson & McCollom, P.C.

(57) ABSTRACT

A lithography device including a first revolver, a second revolver and a driving device. The first revolver includes a transmittance control filter. The second revolver includes transmittance profile filter. The driving device is capable of rotating the second revolver. The first revolver is for positioning the at least one transmittance control filter in the light path. The second revolver is for positioning the at least one transmittance profile filters in the light path.

32 Claims, 6 Drawing Sheets

LITHOGRAPHY DEVICE

This application claims priority from Korean Patent Application No. 2003-46798, filed on Jul. 10, 2003, the contents of which are incorporated herein by reference in their entirety.

BACKGROUND OF THE INVENTION

1. Field of the Invention

The present invention relates to lithography devices and more particularly, to revolving filters to control light transmittance and transmittance profile.

2. Description of the Related Art

Lithography devices have been used in the fabrication processes of semiconductor devices, liquid crystal displays, magnetic thin film heads, imaging devices and micro devices etc., and in doing so, lithography devices have been used to form mask or reticule patterns on wafers coated with a sensitizer (e.g., photoresist) or a glass plate etc. In lithography devices, light intensity and intensity profile should be maintained conformal. If not, depending on light intensity or intensity profile, patterns, which are formed through masks or reticules on a substrate, may be unsharp. As a result, there is difficulty in obtaining a wanted CD (Critical Dimension). Specifically, with high-integration circuits, decreased line width is sensitively influenced by light intensity and intensity profile.

Now, when parallel rays are vertically incident on a boundary surface of a plane, transmittance can be written as $$\text{Transmittance} = (I_t/I_o) \times 100, \text{ where incidence intensity is } I_o \text{ and transmittance intensity is } I_t.$$

In Japanese Laid-Open Publication No. 09-266159, light intensity is controlled by a revolver, revolvers, or a revolver and a plurality of plane filters arranged parallel to the revolver and a plurality of transmittance control filters.

In Korean Laid-Open Publication No. 2003-0024638, light intensity profile is controlled using condenser lens distortion or by interposing at least two filters.

However, the light profile irradiating a subject changes according to various light profile shapes (e.g., conventional, annular, quadrupole and dipole). The intensity uniformity of light also varies with changing NA or SIGMA conditions. Furthermore, the intensity uniformity of light varies based on whether a device is used or not. In this case, intensity uniformity can be represented by $$\text{Intensity uniformity} = \frac{\text{intensity located in a certain position}}{\text{average of entire intensity}} \times 100$$

FIG. 1 shows intensity uniformity in a slit depending on illuminating conditions.

The abscissa axis (or x-axis) represents intensity measurement number for equally spaced measurements taken while moving from one side of a shot to another through a slit. In other words, if the slit length is about 26 mm in the long axis, the measurements are taken by moving 2.6 mm between each measurement, thus resulting in 11 measurements. The ordinate axis (or y-axis) represents intensity uniformity. Intensity uniformity can be represented by $$\text{Intensity uniformity} = \frac{\text{intensity in each position}}{\text{entire intensity of light profile}} \times 100$$

In FIG. 1, intensity uniformity is measured when a transmittance profile filter is used and illuminating conditions are changed. Referring to FIG. 1, since light intensity at both ends is greater than the average intensity, intensity uniformity values are 100% and higher.

In this case, A, C and Q represent annular, conventional and quadrupole, respectively. While, 1, 1' and 3, 3' represent different illuminating conditions, that is, different values of NA and SIGMA.

As shown in FIG. 1 the irradiated subject light intensity profile varies according to the changing illuminating mode (e.g., annular, conventional and quadrupole), as well as the changing NA and Sigma conditions.

FIG. 2 shows variation of light intensity according to the duration of continuous device use. The abscissa axis represents week number. For example, WK10 represents 10 weeks of continuous device use. The ordinate axis represents the ratio (referred to as "intensity profile trend" hereinafter) of the sum and difference of both the maximum and minimum values of intensity profile (mathematical equation 1). Intensity profile can be obtained in the same way as was described for FIG. 1 and can be written as $$\frac{\text{Max Int.} - \text{Min Int.}}{\text{Max Int.} + \text{Min Int.}} \quad \text{[Mathematical equation 1]}$$

where, Max Int. represents the maximum value of intensity uniformity and Min Int. represents the minimum of intensity uniformity.

As shown in FIG. 2, intensity uniformity dramatically changes after about 36 weeks.

Accordingly, it is required that light intensity as well as light intensity profile are controllable in a fabrication device.

SUMMARY OF THE INVENTION

Accordingly, the present invention is directed to a plurality of transmittance control filters and transmittance profile filters with a revolver shape to control light intensity and intensity profile.

To accomplish these and other objects, the present invention includes a plurality of transmittance control filters and transmittance profile filters in a lithography device. The transmittance control filter and the transmittance profile filter both have a revolver shape and are located in the same central axis.

In the field of optical systems where light radiated from a light path to an irradiated subject, a lithography device may comprise of a first revolver and a second revolver on an optical path of light radiated from the light path. The first revolver has a plurality of transmittance control filters that are capable of being located in a direction intersecting the optical path. The second revolver also has a plurality of transmittance profile filters that are capable of being located in a direction intersecting the light path. In addition, the second revolver is adjacent to the first revolver and located on the same center axis as the first revolver.

As occasion demands, a third revolver having a plurality of transmittance profile filters may be adjacent to the first and second revolvers and be located on the same axis. The third revolver may have at least one transparent filter (e.g., a filter that is independent of intensity variation).

The revolver herein has a plurality of circular filters arranged conformally on a plane in a circle. Each of the circular filters is smaller than the plane and located a certain distance from the center of the plane.

The transmittance control filter changes the intensity of the light path as a whole. Preferably, the plurality of transmittance control filters with different transmittances has the same transmittance as any filter.

In an embodiment of a transmittance control revolver there are about 4~5 different filters.

That is, as shown in table 1, the transmittance control filter may have four different filters.

TABLE 1

| TCP | Filter 1 | Filter 2 | Filter 3 | Filter 4 |
|---|---|---|---|---|
| Transmittance (%) | 99.5 | 99 | 98 | 97.5 | where, TCP represents a transmittance control filter.

The transmittance profile filter changes the intensity profile of the light path and has a transmittance that varies across the filter. Preferably, each of the plurality of transmittance profile filters have different transmittance profiles.

In an embodiment of a transmittance profile revolver, there are about 4~5 different filters.

That is, as shown in table 2, the transmittance control filter may have five different filters.

However, the third revolver may have at least one transparent filter (e.g., a filter that is independent of intensity variation).

TABLE 2

| | Center | | | Edge |
|---|---|---|---|---|
| Filter 1 | 99(%) | | ~ | 100(%) Linear variation |
| Filter 2 | 99(%) | | ~ | 99.5(%) Linear variation |
| Filter 3 | 99(%) | 99(%) | 99(%) | 99.7(%) 100 (%) |
| Filter 4 | 99(%) | | ~ | 98.5(%) Linear variation |
| Filter 5 | 99(%) | | ~ | 98(%) Linear variation |

Where, abscissa represents distance from the center of the filter to the edge.

Table 2 shows transmittance according to position in the transmittance profile filter. For example, filter 3 represents transmittance at points from the center of the filter to the edge of it. The transmittance varies linearly between the shown transmittances.

In one embodiment, the transmittance control filter and the transmittance profile filter may be formed using optical film. In addition, they may also be formed by depositing a micro-dot shading material or a photosensitive material on a substrate, where the density of the micro-dots varies. However, the method for forming them is not limited to such techniques.

Preferably, the transmittance control filter is located in the light path. The first, second and third (as occasion demands) revolvers may be located before the light passing a condenser lens reaches a reticle.

Furthermore, the revolver may be separable from the lithography device to modify the filters in the revolver. In addition, the individual filters may be separable from the revolver.

The lithography device may further include a driving device. The driving device is capable of rotating the first, second and third (as occasion demands) revolvers, respectively. The driving device may be controlled by hand or automatically.

The lithography device may further include a sensor and a controller to operate the driving device automatically. The sensor senses light intensity verses the light's position in shot. In the controller, the driving device may be controlled based on a determination of average intensity and intensity profile from the sensor signal.

Preferably, the sensor is located to sense intensity after light passes the transmittance control filter and transmittance profile filter. The sensed intensity and intensity profile should be similar to the intensity and intensity profile of the light irradiated at a subject.

The present invention will now be described more fully hereinafter with reference to the accompanying drawings, in which preferred embodiments of the invention are shown. This invention may, however, be embodied in different forms and should not be construed as limited to the embodiments set forth herein.

DETAILED DESCRIPTION OF THE INVENTION

Reference will now be made in detail to preferred embodiments of the present invention, examples of which are illustrated in the accompanying drawings. However, the present invention is not limited to the embodiments illustrated herein after, and the embodiments herein are rather introduced to provide an easy and complete understanding of the scope and spirit of the present invention.

Figure 1:
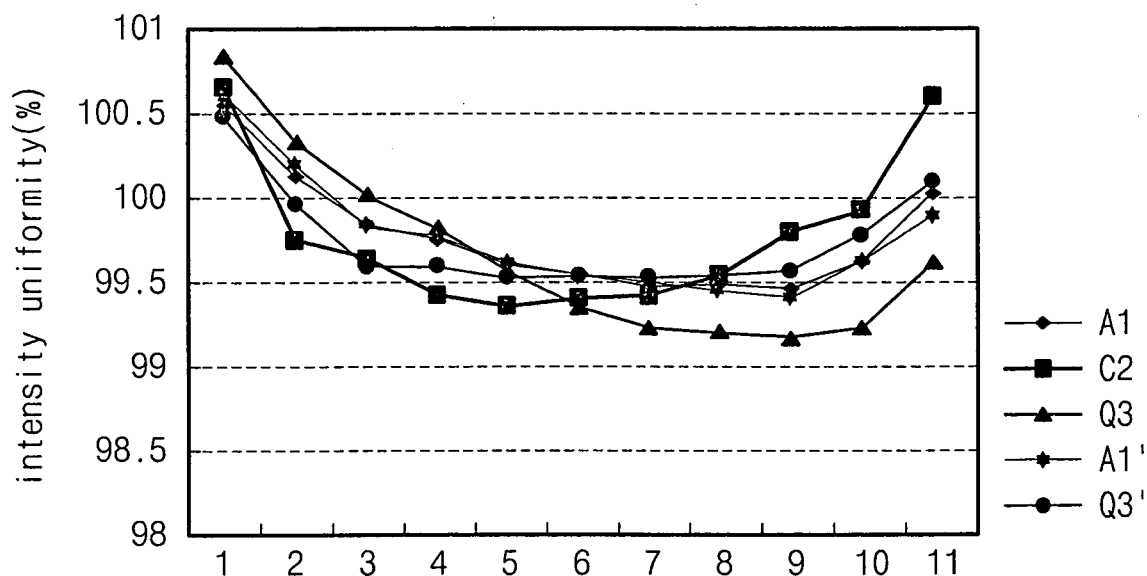
FIG. 1 shows intensity uniformity in a slit depending on illuminating conditions in a lithography device employing a general filter.
Figure 2:
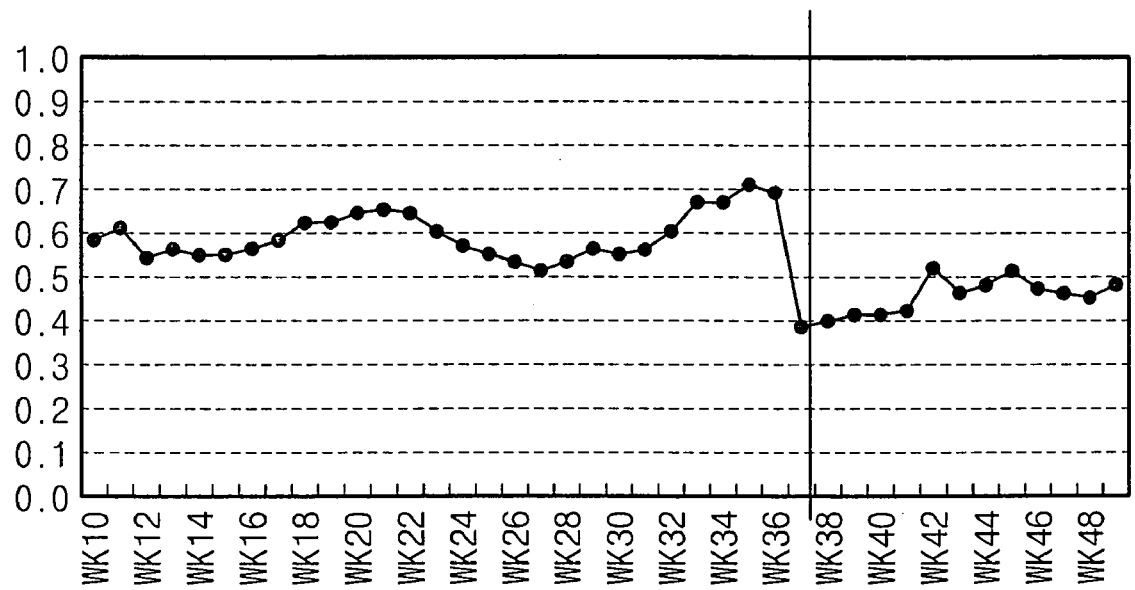
FIG. 2 shows light intensity variance in the slit in a case where the device is used in a lithography device employing a general filter.
Figure 3A:
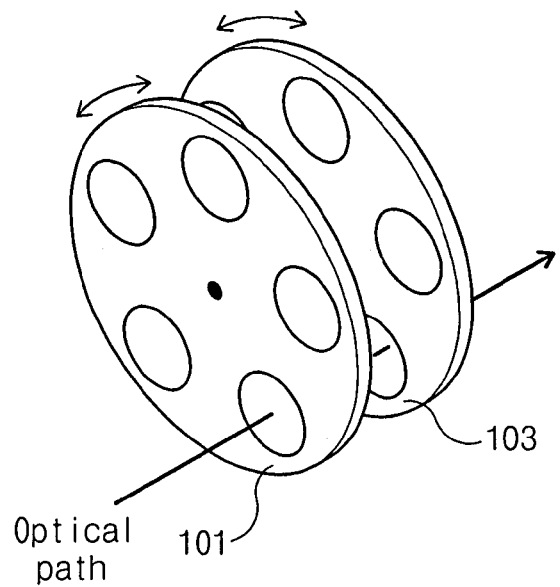
FIGS. 3A and 3B show a revolver having a transmittance control filter and a transmittance profile filter according to an embodiment of the present invention.
Figure 3B:
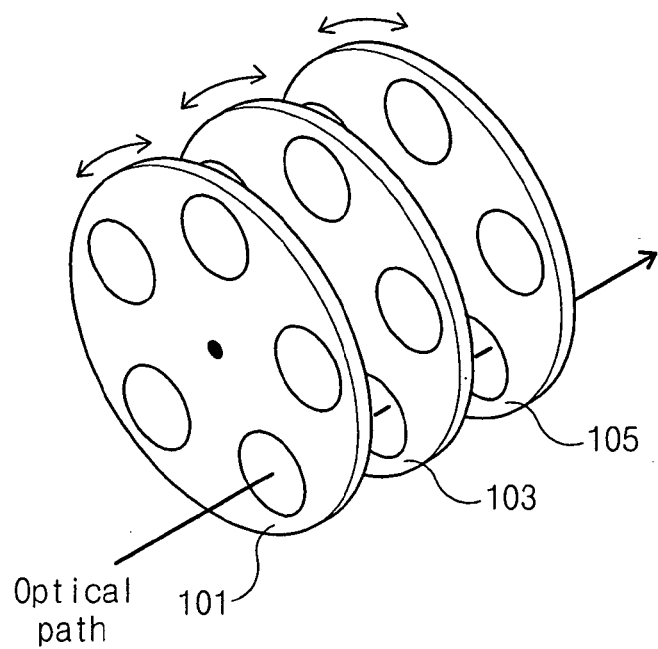

FIGS. 3A and 3B show revolvers with transmittance control filters and transmittance profile filters according to an embodiment of the present invention.

Referring to FIG. 3A, a first revolver 101 has transmittance control filters on a driving axle. A second revolver 103 has transmittance profile filters. In another approach, the first and second revolvers 101 and 103 are constituted so as to place the filters installed on the revolvers in a light path. The first and second revolvers 101 and 103 may be rotated independently, so that various filters are placed in the light path. In this case, rotation direction is of no concern.

Referring to FIG. 3B, a third revolver 105 may also be included. The third revolver 105 may have at least one transparent filter (e.g., a filter that is independent of variation of intensity).

Figure 4:
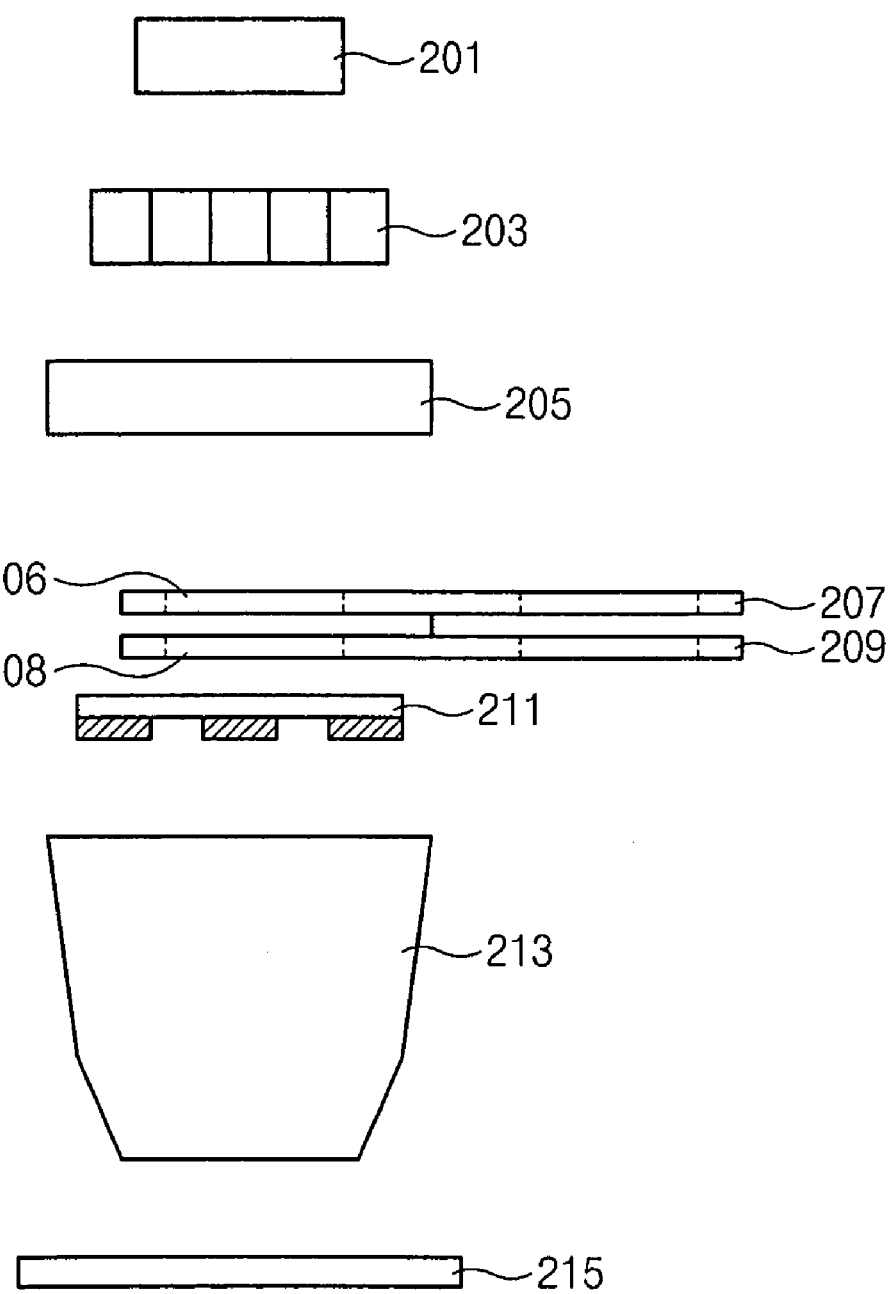
FIG. 4 is a schematic showing the construction of a lithography device according to an embodiment of the present invention.

FIG. 4 is a schematic representation of the construction of a lithography device according to an embodiment of the present invention.

Referring to FIG. 4, light is radiated from a lithography light path incident on a fly eye lens 203 and a condenser lens 205. In FIG. 4, various devices between light path 201 and the fly eye lens 203 and between the fly eye lens 203 and the condenser lens 205 are omitted and the size of them is exaggerated for clarity. After light passing the condenser lens 205 is incident to the transmittance control filter 206 and the transmittance profile filter 208, it passes a reticule 211 and a projection lens 213 to irradiate a wafer 215. The transmittance control filter 205 is formed in the first revolver 207, and the transmittance profile filter 208 is formed in the second revolver 209. FIG. 4 represents only the embodiment shown in FIG. 3A. However, the embodiment of FIG. 3B would be shown if a third revolver is added under the second revolver 209.

Figure 5:
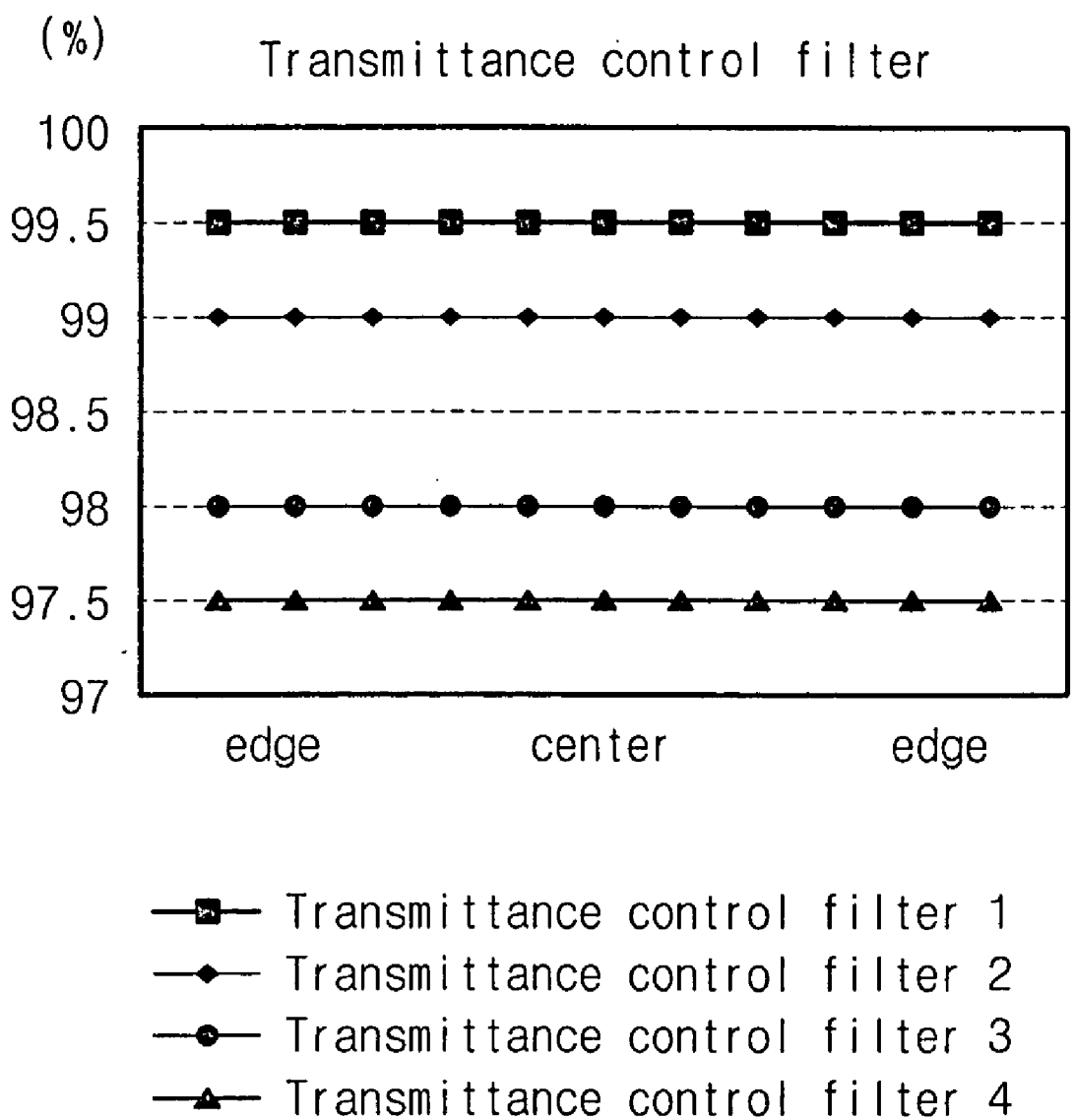
FIG. 5 shows filter transmittance and an embodiment of the transmittance control filter of the present invention.

FIG. 5 shows filter transmittance and one embodiment of the transmittance control filter of the present invention.

Referring to FIG. 5, the abscissa axis represents distance variation from the center of the filter to the edge of it, and the ordinate axis represents transmittance (%). Since the transmittance is constant across the whole filter, average transmittance can be changed.

Figure 6:
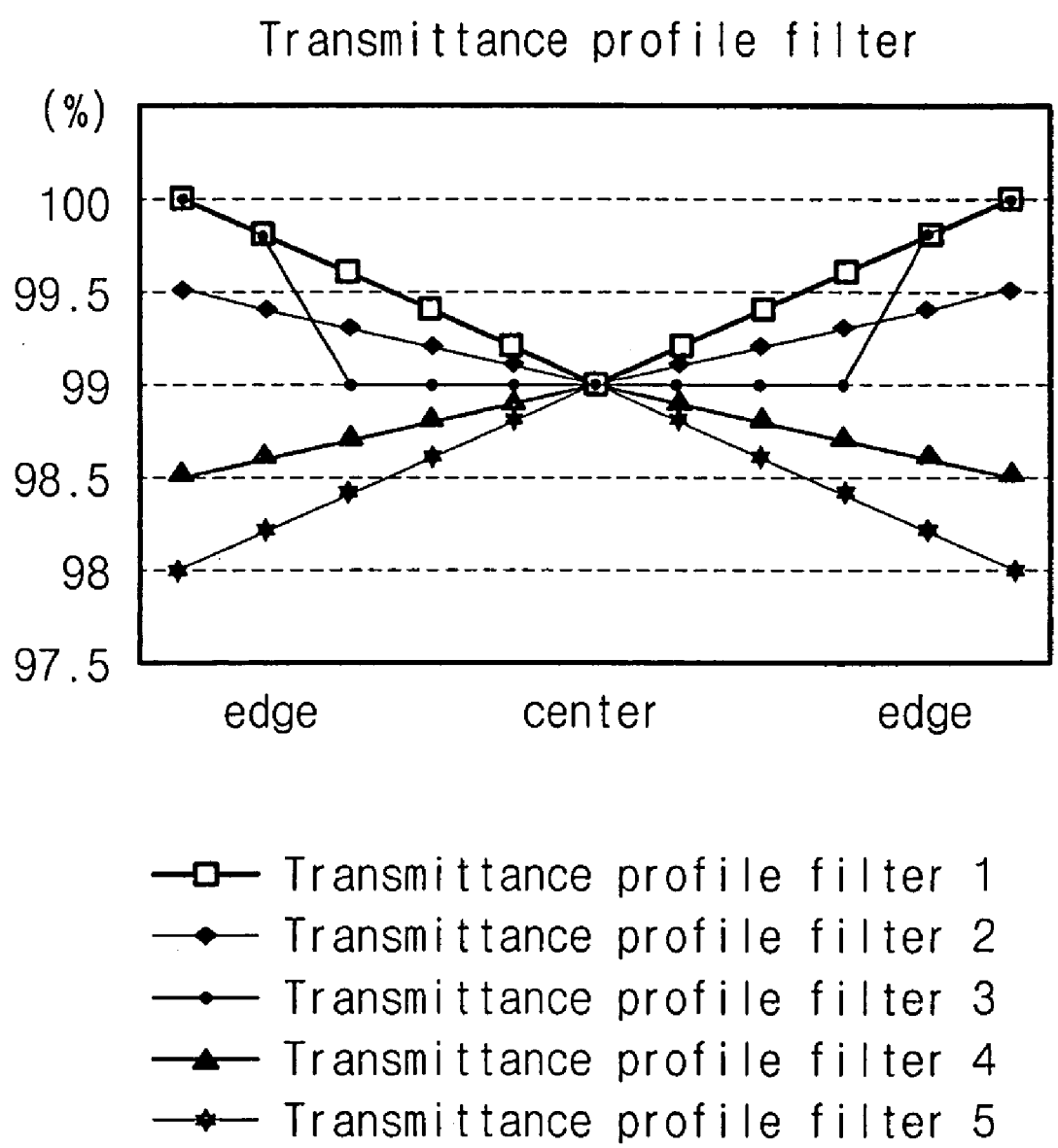
FIG. 6 shows filter transmittance profile and an embodiment of the transmittance profile filter of the present invention.

FIG. 6 shows filter transmittance profile and one embodiment of the transmittance profile filter of the present invention.

Referring to FIG. 6, the abscissa axis represents distance variation from the center of the filter to the edge of it, and the ordinate axis represents transmittance (%). Generally, filters (such as filters 1, 2 and 3) have a transmittance profile that varies inversely with the intensity profile of the light path. However, to cope with the changing of various illuminating modes and intensity according to NA and Sigma conditions or according to working time, filters (such as filters 4 and 5) do not have a transmittance profile that varies inversely with the intensity profile of the light path may be further included.

As previously mentioned, according to the present invention, a wanted transmittance and transmittance profile can be obtained by rotating revolvers having a plurality of transmittance control filters or transmittance profile filters. Therefore, there is the advantage of being able to revise variations of light intensity by changing illuminating modes and illuminating conditions.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A lithography device for radiating light along a light path on a subject comprising:
    a first revolver;
    a second revolver;
    at least one transmittance control filter that changes the intensity of the light passing through each said transmittance control filter; and
    at least one transmittance profile filter that has a transmittance that varies across the transmittance profile filter, and which changes the intensity profile of the light passing through the transmittance profile filter,
    wherein the first revolver is for positioning at least one transmittance control filter in the light path, and the second revolver is for positioning at least one transmittance profile filter in the light path, a desired transmittance and transmittance profile being obtained by rotating the first revolver and the second revolver, respectively.

2. The device of claim 1, wherein the second revolver is positioned on the same center axis as the first revolver.

3. The device of claim 1, wherein the first and second revolvers are positioned between a condenser lens and a reticule of the lithography device.

4. The device of claim 1, wherein at least one of the transmittance control filters and transmittance profile filters is formed using an optical film.

5. The device of claim 1, wherein at least one of the filters is formed by a micro-dot shading material deposition or a photosensitive material deposition.

6. The device of claim 1, wherein the revolvers are removable from the lithography device.

7. The device of claim 1, wherein the transmittance control filter and/or transmittance profile filter can be removed from the revolvers.

8. The device of claim 1, further comprising a driving device for positioning the filters in the light path by rotating the first and second revolvers.

9. The device of claim 1, further comprising a driving device operated automatically for positioning the filters in the light path by rotating the first and second revolvers.

10. The device of claim 8, further comprising:
    a sensor that senses light intensity verses light position; and
    a controller for operating the driving device.

11. The device of claim 10, wherein the sensor senses intensity after the light passes the transmittance control filter and the transmittance profile filter.

12. The device of claim 10, wherein the control of the driving device is based on a determination of average intensity and intensity profile from the sensor.

13. The device of claim 1, further comprising a third revolver capable of positioning at least one transmittance profile filter.

14. The device on claim 13, where in the third revolver is placed in a direction intersecting an equivalent light path and in the same axis as the second revolver.

15. The device of claim 13, wherein the first, second and third revolvers are positioned between the condenser lens and the reticule.

16. The device of claim 13, wherein at least one of the transmittance control filters and transmittance profile filters is formed using an optical film.

17. The device of claim 13, wherein at least one of the transmittance control filters and transmittance profile filters is formed by depositing a micro-dot shading material or a photosensitive material on a substrate.

18. The device of claim 13, wherein the revolvers are removable from the lithography device.

19. The device of claim 18, wherein the individual filters are removable from the revolver.

20. The device of claim 13, further comprising a driving device that is capable of positioning the filters in the light path by rotating the first, second and third revolvers.

21. The device of claim 13, further comprising a driving device operated automatically that is capable of positioning the filters in the light path by rotating the first, second and third revolvers.

22. The device of claim 21, further comprising:
a sensor that senses light intensity verses light position; and
a controller for operating the driving device.

23. The device of claim 22, wherein the sensor senses intensity after the light passes the transmittance control filter and the transmittance profile filters.

24. The device of claim 22, wherein the control of the driving device is based on a determination of average intensity and intensity profile from the sensor.

25. The device of claim 13, wherein the third revolver has at least one transparent filter.

26. An optical filtering method comprising:
radiating light from a lithography device down a light path;
filtering the light through at least one transmittance control filter that changes the intensity of the light;
filtering the light through at least one transmittance profile filter that has a transmittance that varies across filter and changes the intensity profile of the light;
rotating a first revolver and a second revolver, respectively to obtain a desired transmittance and transmittance profile; and
radiating said filtered light down said light path onto a subject.

27. The method of claim 26, wherein at least one transmittance control filter is provided in the first revolver.

28. The method of claim 26, wherein at least one transmittance profile filter is provided in the second revolver.

29. The method of claim 26, wherein at least one transmittance control filter is provided in the first revolver; and
at least one transmittance profile filter is provided in the second revolver.

30. The method of claim 27, further comprising rotating the revolver to place a different filter in the light path.

31. The method of claim 27, wherein the revolver is rotated automatically.

32. The method of claim 26, further comprising filtering the light through an interposed third revolver capable of positioning at least one transmittance profile filter in the light path.

* * * * *